(12) United States Patent
Mundt et al.

(10) Patent No.: US 10,976,215 B2
(45) Date of Patent: Apr. 13, 2021

(54) SYSTEM AND METHOD OF DETERMINING COOLANT LEAKS WITHIN INFORMATION HANDLING SYSTEMS

(71) Applicant: Dell Products L.P., Round Rock, TX (US)

(72) Inventors: Kevin Warren Mundt, Austin, TX (US); Sandor Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/271,165

(22) Filed: Feb. 8, 2019

(65) Prior Publication Data

US 2020/0256758 A1  Aug. 13, 2020

(51) Int. Cl.
   *G06F 1/20*     (2006.01)
   *G01M 3/40*     (2006.01)
   *H05K 7/20*     (2006.01)

(52) U.S. Cl.
   CPC .......... *G01M 3/40* (2013.01); *G06F 1/20* (2013.01); *H05K 7/20272* (2013.01)

(58) Field of Classification Search
   None
   See application file for complete search history.

(56) References Cited

U.S. PATENT DOCUMENTS

| | | | |
|---|---|---|---|
| 9,823,286 B2* | 11/2017 | Connell | G01R 31/00 |
| 9,852,963 B2* | 12/2017 | Shedd | F25B 23/006 |
| 10,306,753 B1* | 5/2019 | Fadden | H05K 5/0208 |
| 2005/0269213 A1* | 12/2005 | Steimle | G01N 17/04 |
| | | | 205/775.5 |
| 2006/0032761 A1* | 2/2006 | Oguri | G01N 27/121 |
| | | | 205/788 |
| 2007/0259469 A1* | 11/2007 | Santagato | B41J 2/17566 |
| | | | 438/49 |
| 2011/0109333 A1* | 5/2011 | Porjo | G01M 3/16 |
| | | | 324/694 |
| 2012/0038374 A1* | 2/2012 | Johnson | G01M 3/045 |
| | | | 324/694 |
| 2018/0284011 A1* | 10/2018 | Farkas | G01R 17/02 |

OTHER PUBLICATIONS

TI Designs: TIDA-01518, Low-Power Flood and Freeze Detector Reference Design with Sub-1 GHz and 10-Year Coin Cell Battery Life, Texas Instruments, Oct. 2017; 33 pages.
Rain Drop Sensor, Technical Manual Rev 1r0, e-Gizmo Mechatronix Central (2016); 5 pages.

* cited by examiner

*Primary Examiner* — Courtney L Smith
(74) *Attorney, Agent, or Firm* — Baker Botts L.L.P.

(57) ABSTRACT

In one or more embodiments, one or more systems, methods, and/or processes may receive a digital voltage value from an analog to digital converter; may determine a resistance value of a device that includes a plurality of conductors separated from each other by a distance and a material that includes a substance that forms an electrically conductive solution when dissolved by a polar solvent and that is configured to receive a liquid that removes heat from one or more components of the information handling system; may determine that the resistance value of the device is at or below a threshold resistance value; and in response to determining that the resistance value of the device is at or below the threshold resistance value, may provide information that indicates a leak of the liquid.

16 Claims, 12 Drawing Sheets

SYSTEM AND METHOD OF DETERMINING COOLANT LEAKS WITHIN INFORMATION HANDLING SYSTEMS

BACKGROUND

Field of the Disclosure

This disclosure relates generally to information handling systems and more particularly to determining coolant leaks within information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments, one or more systems, methods, and/or processes may transferring, via multiple liquid transfer lines, a liquid that removes heat from one or more components of an information handling system. In one or more embodiments, the information handling system may include a device that is configured to receive the liquid if a leak of at least one of the multiple liquid transfer lines occurs. For example, the device may include multiple exposed conductors separated from each other by a distance and a material that includes substance that forms an electrically conductive solution when dissolved by a polar solvent. In one or more embodiments, the one or more systems, methods, and/or processes may further receive a digital voltage value from an analog to digital converter (ADC); may further determine a resistance value of the device based at least on the digital voltage value from the ADC; may determine that the resistance value of the device is at or below a threshold resistance value; and in response to determining that the resistance value of the device is at or below the threshold resistance value, may further provide information that indicates a leak of the liquid. For example, the liquid may be or include the polar solvent. For instance, the polar solvent may be or include water ($H_2O$). In one or more embodiments, the ADC may determine a voltage value associated with a conductor of the multiple exposed conductors. For example, the ADC may transform the voltage value associated with the conductor of the multiple exposed conductors into the digital voltage value. For instance, the voltage value associated with the conductor of the multiple exposed conductors may be an analog voltage value associated with the conductor of the multiple exposed conductors.

In one or more embodiments, providing information that indicates the leak of the liquid may include providing the information that indicates the presence of the liquid on the device to a network communicatively coupled to the information handling system. In one or more embodiments, the information handling system may include the device that includes the multiple exposed conductors separated from each other by the distance and the material that includes the substance that forms the electrically conductive solution when dissolved by the polar solvent. In one or more embodiments, the substance that forms the electrically conductive solution when dissolved by the polar solvent may include a salt. For example, the salt may include at least one of sodium chloride (NaCl), potassium chloride (KaCl), and sodium bicarbonate ($NaHCO_3$), among others. In one or more embodiments, the liquid may include water ($H_2O$). For example, the water may be or include the polar solvent. In one or more embodiments, the liquid may include glycol.

In one or more embodiments, the one or more systems, methods, and/or processes may further shut down an operating system executing on the information handling system. For example, shutting down an operating system executing on the information handling system may be performed in response to determining that the resistance value of the device is at or below the threshold resistance value. In one or more embodiments, the one or more systems, methods, and/or processes may further shut down the information handling system. For example, shutting down the information handling system may performed in response to determining that the resistance value of the device is at or below the threshold resistance value.

In one or more embodiments, a device, that includes multiple exposed conductors separated from each other by a distance and a material that includes a substance that forms an electrically conductive solution when dissolved by a polar solvent, may receive a liquid. In one or more embodiments, the device may form the electrically conductive solution of the substance and the liquid. For example, the liquid may be or include the polar solvent. In one or more embodiments, a resistance value of the device may be determined. In one or more embodiments, it may be determined that the resistance value of the device is at or below a threshold resistance value. In one or more embodiments, information that indicates a presence of the liquid on the device may be provided. For example, the information that indicates the presence of the liquid on the device may be provided in response to determining that the resistance value of the device is at or below the threshold resistance value. In one or more embodiments, the information that indicates the presence of the liquid on the device may include the resistance value of the device. In one or more embodiments, the information that indicates the presence of the liquid on the device may be provided to a network. For example, the information that indicates the presence of the liquid on the device may be provided to another information handling system via the network. In one or more embodiments, information that indicates a leak of the liquid may be provided. For example, the information that indicates the leak of the liquid may be provided in response to determining that the resistance value of the device is at or below the threshold resistance value.

In one or more embodiments, determining the resistance value of the device may include an ADC determining a voltage value associated with a conductor of the multiple exposed conductors. In one or more embodiments, determining the amount of current that flows through the resistor may include determining a difference of a power supply voltage value and the voltage value associated with the conductor of the multiple exposed conductors and dividing the difference by a resistance value of the resistor. In one or more embodiments, determining the amount of current that flows through the resistor includes determining a quotient of the voltage value associated with the conductor of the multiple exposed conductors and a resistance value of the resistor.

In one or more embodiments, a device may include a printed circuit board that includes at least two exposed conductor traces on a first side of the printed circuit board that are not in contact with each other; a material, that includes a substance that forms an electrically conductive solution when dissolved by a polar solvent, in contact with the at least two exposed conductor traces and fastened to at least one of the printed circuit board and the at least two exposed conductor traces; and a fastener on a second side of the printed circuit board, opposite the first side of the printed circuit board, among others. In one or more embodiments, the substance that forms the electrically conductive solution when dissolved by the polar solvent of the material may include a salt. For example, the salt may include at least one of sodium chloride (NaCl), potassium chloride (KaCl), and sodium bicarbonate ($NaHCO_3$), among others. In one or more embodiments, the fastener on the second side of the printed circuit board may include an adhesive. In one or more embodiments, a resistance between the at least two exposed conductors may be less than one hundred ohms when a polar solvent is applied to the material. For example, a liquid that includes the polar solvent may be utilized to remove heat from one or more components of an information handling system. For instance, the polar solvent may include water ($H_2O$).

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

Figure 1:
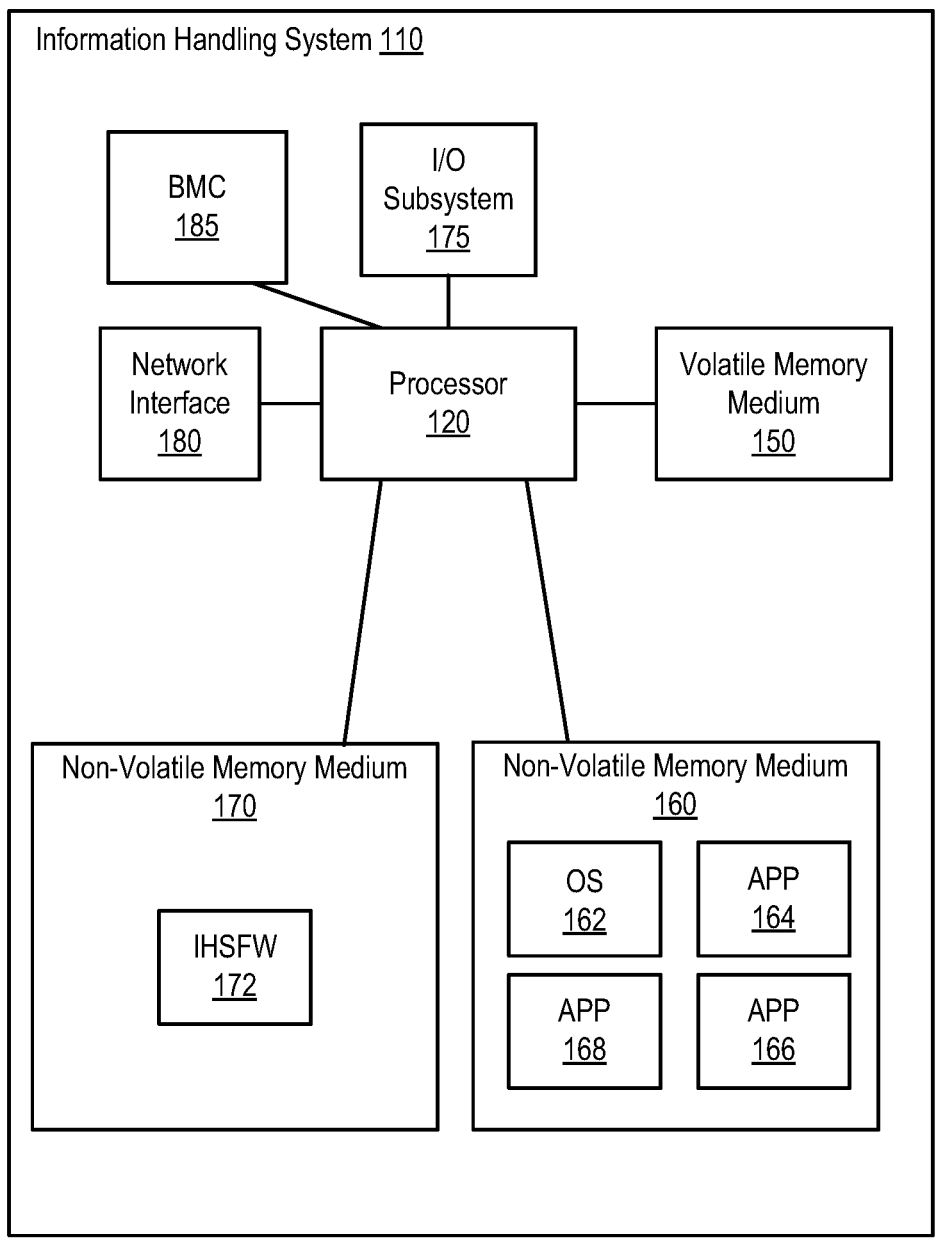
FIG. 1 illustrates an example of an information handling system, according to one or more embodiments.

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

In one or more embodiments, one or more components of an information handling system may be cooled. For example, heat may be removed from one or more components of an information handling system. In one or more embodiments, a liquid may be utilized to cool one or more components of an information handling system. For example, a liquid may be utilized to remove heat from one or more components of an information handling system. In one or more embodiments, a liquid utilized to cool and/or remove heat from one or more components of an information handling system may include a mixture of liquids. For example, the mixture of liquids may include a mixture of water ($H_2O$) and glycol. For instance, the mixture of liquids may include a mixture of seventy-five percent (75%) water and twenty-five percent (25%) propylene glycol.

In one or more embodiments, if a leak of a liquid utilized to cool and/or remove heat from one or more components of an information handling system occurs, one or more portions of the information handling system may be damaged. In one example, the one or more portions of the information handling system that may be damaged may include the one or more components of the information handling system. In a second example, the one or more portions of the information handling system that may be damaged may include one or more other components of the information handling system. In another example, the one or more portions of the information handling system that may be damaged may include one or more circuit boards of the information handling system.

In one or more embodiments, the liquid utilized to cool and/or remove heat from one or more components of the information handling system may cause one or more short circuits. For example, the one or more short circuits may damage the one or more portions of the information handling system. In one or more embodiments, the liquid utilized to cool and/or remove heat from one or more components of the information handling system may cause one or more corrosions. In one example, the one or more corrosions may damage the one or more portions of the information handling system. In another example, the information handling system may not function properly due to the one or more corrosions. In one or more embodiments, the leak of the liquid utilized to cool and/or remove heat from the one or more components of an information handling system may be caused by one or more of vibrations, thermal cycles, aging, oxidation, junction sealant decay, and pests, among others.

In one or more embodiments, the liquid utilized to cool and/or remove heat from one or more components of the information handling system may include water. For example, the water may not include low levels of electrolytes or may include low levels of electrolytes. For instance, the liquid may not be a good conductor of electricity. In one or more embodiments, an electrolyte may include a substance that produces an electrically conducting solution when dissolved in a polar solvent. In one or more embodiments, if the liquid leaks onto a detection circuit that measures electrical conductivity, it may be difficult to determine a leak of the liquid via electrical conductivity, as the liquid may not be a good conductor of electricity. In one or more embodiments, if one or more electrolytes are added to the liquid, the one or more electrolytes may promote and/or accelerate liquid leaks. For example, if one or more electrolytes are added to the liquid, the one or more electrolytes may promote and/or accelerate one or more of aging, oxidation, and junction sealant decay, among others.

In one or more embodiments, a device that may be utilized to determine a leak of the liquid via electrical conductivity may include multiple conductors and a material that includes a substance that forms an electrically conductive solution when dissolved by a polar solvent. In one or more embodiments, the polar solvent may be or include water. For instance, a dissolved substance that forms an electrically conductive solution when dissolved by a polar solvent may separate into cations and anions. For example, the dissolved substance may be or include an electrolyte. In one or more embodiments, if an electric potential is applied to the dissolved substance, the cations may be drawn to a first electrode that has an abundance of electrons and the anions may be drawn to a second electrode that has a deficit of electrons (e.g., holes). For example, movement of the anions and the cations in opposite directions within the dissolved substance may amount to a current. In one or more embodiments, an electrolyte may include a substance that may dissociate into ions in solution and may acquire a capacity to conduct electricity. For example, an electrolyte may include one or more of a soluble salt, an acid, and a base, among others. For instance, an electrolyte may include one or more of sodium, potassium, chloride, calcium, magnesium, and phosphate, among others. In one or more embodiments, a substance that forms an electrically conductive solution when dissolved by a polar solvent may include one or more of a soluble salt, an acid, and a base, among others. For example, the substance that forms the electrically conductive solution when dissolved by the polar solvent may include one or more of sodium, potassium, chloride, calcium, magnesium, and phosphate, among others.

In one or more embodiments, the liquid utilized to cool and/or remove heat from one or more components of the information handling system may leak and may travel to the device that may include multiple conductors and a material that includes a substance that forms an electrically conductive solution when dissolved by a polar solvent. For example, the liquid and the substance of the material may form the electrically conductive solution that may conduct electricity among or between the multiple conductors of the device. For instance, a resistance value between two conductors of the device may be lower when the conductors of the device are exposed to the electrically conductive solution that includes the liquid and the substance. In one or more embodiments, the material that includes the substance that forms the electrically conductive solution when dissolved by the polar solvent may not be hygroscopic. In one or more embodiments, the material that includes the substance that forms the electrically conductive solution when dissolved by the polar solvent may be porous. For example, the material that includes the substance that forms the electrically conductive solution when dissolved by the polar solvent may include multiple pores. In one instance, the pores may permit the liquid to permeate the material that includes the substance that forms the electrically conductive solution when dissolved by the polar solvent. In another instance, the pores may permit the liquid to be transferred to the conductors of the device. In one or more embodiments, the pores may transfer the liquid to one or more of the electrolyte and the conductors of the device via capillary action. In one example, the capillary action may transfer a solution of the liquid and the substance that forms the electrically conductive solution when dissolved by the polar solvent to the conductors of the device. In another example, the capillary action may mix the liquid and the substance that forms the electrically conductive solution when dissolved by the polar solvent to form a solution of the liquid and the substance. For instance, the capillary action may cause the liquid and the substance to form the solution of the liquid and the substance and may transport the solution of the liquid and the substance to the conductors of the device.

In one or more embodiments, the device that includes the conductors and the material that includes the electrolyte may be placed in an area where a leak of the liquid is likely to occur. In one or more embodiments, the device that includes the conductors and the material that includes the electrolyte may be placed in an area where detecting a leak of the liquid is important. In one or more embodiments, the device that includes the conductors and the material that includes the electrolyte may be fastened to the area. For example, the device may include a fastener. For instance, the fastener may include an adhesive material.

Turning now to FIG. 1, an example of an information handling system is illustrated, according to one or more embodiments. An information handling system (IHS) 110 may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, IHS 110 may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS 110 may include or have a form factor of that of or similar to one or more of a laptop, a notebook, a telephone, a tablet, and a PDA, among others. For example, a portable IHS 110 may be readily carried and/or transported by a user (e.g., a person). In one or more embodiments, components of IHS 110 may include one or more storage devices, one or more communications ports for communicating with external devices as well as various input and output (I/O) devices, such as a keyboard, a mouse, and a video display, among others. In one or more embodiments, IHS 110 may include one or more buses operable to transmit communication between or among two or more hardware components. In one example, a bus of IHS 110 may include one or more of a memory bus, a peripheral bus, and a local bus, among others. In another example, a bus of IHS 110 may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, IHS 110 may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

As shown, IHS 110 may include a processor 120, a volatile memory medium 150, non-volatile memory media 160 and 170, an I/O subsystem 175, a network interface 180, and a baseboard management controller (BMC) 185. As illustrated, volatile memory medium 150, non-volatile memory media 160 and 170, I/O subsystem 175, and network interface 180 may be communicatively coupled to processor 120.

In one or more embodiments, one or more of volatile memory medium 150, non-volatile memory media 160 and 170, I/O subsystem 175, network interface 180, and BMC 185 may be communicatively coupled to processor 120 via one or more buses, one or more switches, and/or one or more root complexes, among others. In one example, one or more of volatile memory medium 150, non-volatile memory media 160 and 170, I/O subsystem 175, and network interface 180 may be communicatively coupled to processor 120 via one or more PCI-Express (PCIe) root complexes. In another example, one or more of an I/O subsystem 175 and a network interface 180 may be communicatively coupled to processor 120 via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

Volatile memory medium 150 may include volatile storage such as, for example, RAM, DRAM (dynamic RAM), EDO RAM (extended data out RAM), SRAM (static RAM), etc. One or more of non-volatile memory media 160 and 170 may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, a magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, network interface 180 may be utilized in communicating with one or more networks and/or one or more other information handling systems. In one example, network interface 180 may enable IHS 110 to communicate via a network utilizing a suitable transmission protocol and/or standard. In a second example, network interface 180 may be coupled to a wired network. In a third example, network interface 180 may be coupled to an optical network. In another example, network interface 180 may be coupled to a wireless network.

In one or more embodiments, network interface 180 may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, processor 120 may execute processor instructions in implementing at least a portion of one or more systems, one or more flowcharts, one or more methods, and/or one or more processes described herein. In one example, processor 120 may execute processor instructions from one or more of memory media 150-170 in implementing at least a portion of one or more systems, one or more flowcharts, one or more methods, and/or one or more processes described herein. In another example, processor 120 may execute processor instructions via network interface 180 in implementing at least a portion of one or more systems, one or more flowcharts, one or more methods, and/or one or more processes described herein.

In one or more embodiments, processor 120 may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, processor 120 may interpret and/or execute program instructions and/or process data stored locally (e.g., via memory media 150-170 and/or another component of IHS 110). In another example, processor 120 may interpret and/or execute program instructions and/or process data stored remotely (e.g., via a network storage resource).

In one or more embodiments, I/O subsystem 175 may represent a variety of communication interfaces, graphics interfaces, video interfaces, user input interfaces, and/or peripheral interfaces, among others. For example, I/O subsystem 175 may include one or more of a touch panel and a display adapter, among others. For instance, a touch panel may include circuitry that enables touch functionality in conjunction with a display that is driven by a display adapter.

As shown, non-volatile memory medium 160 may include an operating system (OS) 162, and applications (APPs) 164-168. In one or more embodiments, one or more of OS 162 and APPs 164-168 may include processor instructions executable by processor 120. In one example, processor 120 may execute processor instructions of one or more of OS 162 and APPs 164-168 via non-volatile memory medium 160. In another example, one or more portions of the processor instructions of the one or more of OS 162 and APPs 164-168 may be transferred to volatile memory medium 150, and processor 120 may execute the one or more portions of the processor instructions of the one or more of OS 162 and APPs 164-168 via volatile memory medium 150.

As illustrated, non-volatile memory medium 170 may include information handling system firmware (IHSFW) 172. In one or more embodiments, IHSFW 172 may include processor instructions executable by processor 120. For example, IHSFW 172 may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, processor 120 may execute processor instructions of IHSFW 172 via non-volatile memory medium 170. In another instance, one or more portions of the processor instructions of IHSFW 172 may be transferred to volatile memory medium 150, and processor 120 may execute the one or more portions of the processor instructions of IHSFW 172 via volatile memory medium 150.

In one or more embodiments, BMC 185 may be or include a remote access controller. For example, the remote access controller may be or include a Dell Remote Access Controller (DRAC). In one or more embodiments, a remote access controller may be integrated into IHS 110. For example, the remote access controller may be or include an integrated Dell Remote Access Controller (iDRAC). In one or more embodiments, a remote access controller may include one or more of a processor, and a memory, a network interface, among others. In one or more embodiments, a remote access controller may access one or more busses and/or one or more portions of IHS 110. For example, the remote access controller may include and/or may provide power management, virtual media access, and/or remote console capabilities, among others, which may be available via a web browser and/or a command line interface. For instance, the remote access controller may provide and/or permit an administrator (e.g., a user) one or more abilities to configure and/or maintain an information handling system as if the administrator was at a console of the information handling system and/or had physical access to the information handling system.

In one or more embodiments, a remote access controller may interface with baseboard management controller integrated circuits. For example, the remote access controller may be based at least on an Intelligent Platform Management Interface (IPMI) standard. For instance, the remote access controller may allow and/or permit utilization of IPMI out-of-band interfaces such as IPMI Over LAN (local area network). In one or more embodiments, a remote access controller may include and/or provide one or more internal private networks. For example, the remote access controller may include and/or provide one or more of an Ethernet interface, a front panel USB interface, and a Wi-Fi interface, among others.

In one or more embodiments, BMC 185 may be or include a microcontroller. For example, the microcontroller may be or include an 8051 microcontroller, an ARM Cortex-M (e.g., Cortex-M0, Cortex-M04, Cortex-M1, Cortex-M3, Cortex-M4, Cortex-M7, etc.) microcontroller, a MSP430 microcontroller, an AVR (e.g., 8-bit AVR, AVR-32, etc.) microcontroller, a PIC microcontroller, a 68HC11 microcontroller, a ColdFire microcontroller, and a Renesas microcontroller, among others. In one or more embodiments, BMC 185 may be configured, coded, and/or encoded with instructions in accordance with one or more of systems, flowcharts, methods, and/or processes described herein. In one or more embodiments, BMC 185 may be configured to implement at least a portion of one or more systems, one or more flowcharts, one or more methods, and/or one or more processes described herein. In one or more embodiments, BMC 185 may be or include one or more of a field programmable gate array (FPGA) and an ASIC, among others, configured, coded, and/or encoded with instructions in accordance with one or more of systems, one or more flowcharts, one or more methods, and/or one or more processes described herein.

In one or more embodiments, processor 120 and one or more components of IHS 110 may be included in a system-on-chip (SoC). For example, the SoC may include processor 120 and a platform controller hub (not specifically illustrated).

Figure 2A:
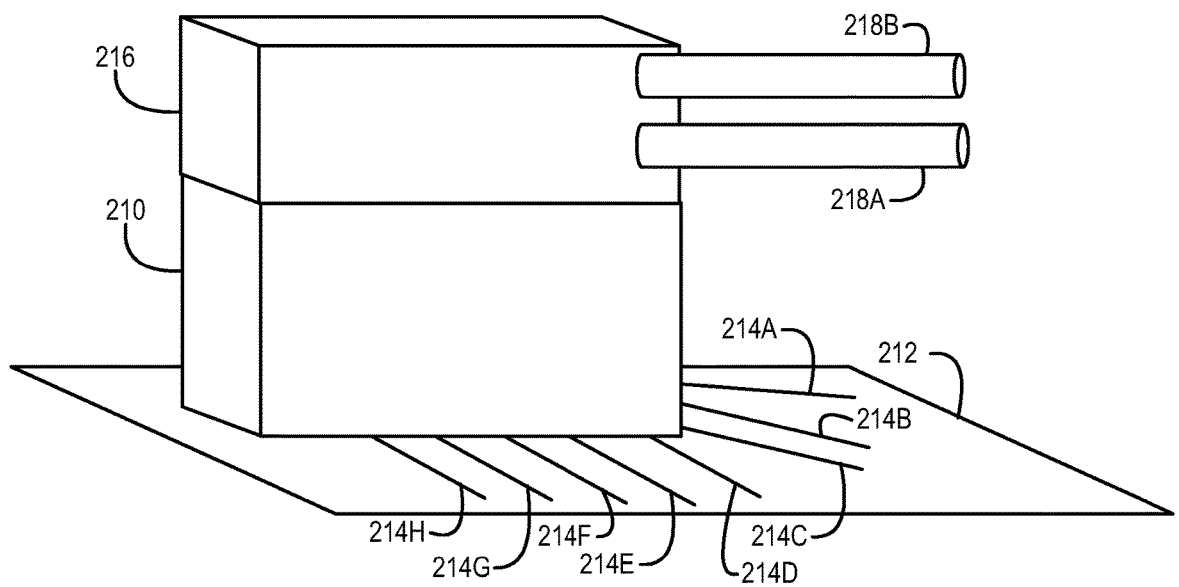
FIG. 2A illustrates an example of a circuit board and a component of an information handling system, according to one or more embodiments.

Turning now to FIG. 2A, an example of a circuit board and a component of an information handling system is illustrated, according to one or more embodiments. As shown, a component 210 may be mounted on a circuit board 212. In one or more embodiments, IHS 110 may include component 210 and circuit board 212. In one or more embodiments, a liquid that removes heat from one or more components 210 may be transferred via multiple liquid transfer lines. As illustrated, circuit board 212 may include circuit board traces 214A-214H. In one example, one or more of circuit board traces 214A-214H may communicatively couple component 210 to another component of IHS 110. In another example, one or more of circuit board traces 214A-214H may provide power to component 210. As shown, a heat removal device 216 may be mounted to component 210. As illustrated, liquid transfer lines 218A and 218B may be coupled to heat removal device 216. In one example, liquid may be provided to heat removal device 216 via liquid transfer line 218A. In another example, liquid may be received from heat removal device 216 via liquid transfer line 218B. For instance, liquid may be removed from heat removal device 216 via liquid transfer line 218B. In one or more embodiments, a liquid transfer line 218 may be or include one or more of a liquid transfer duct, a liquid transfer conduit, a liquid transfer tube, a liquid transfer hose, and a liquid transfer pipe, among others. In one or more embodiments, heat removal device 216 may remove heat from component 210. In one or more embodiments, liquid may remove heat from heat removal device 216. For example, liquid may remove the heat that heat removal device 216 removed heat from component 210.

Figure 2B:
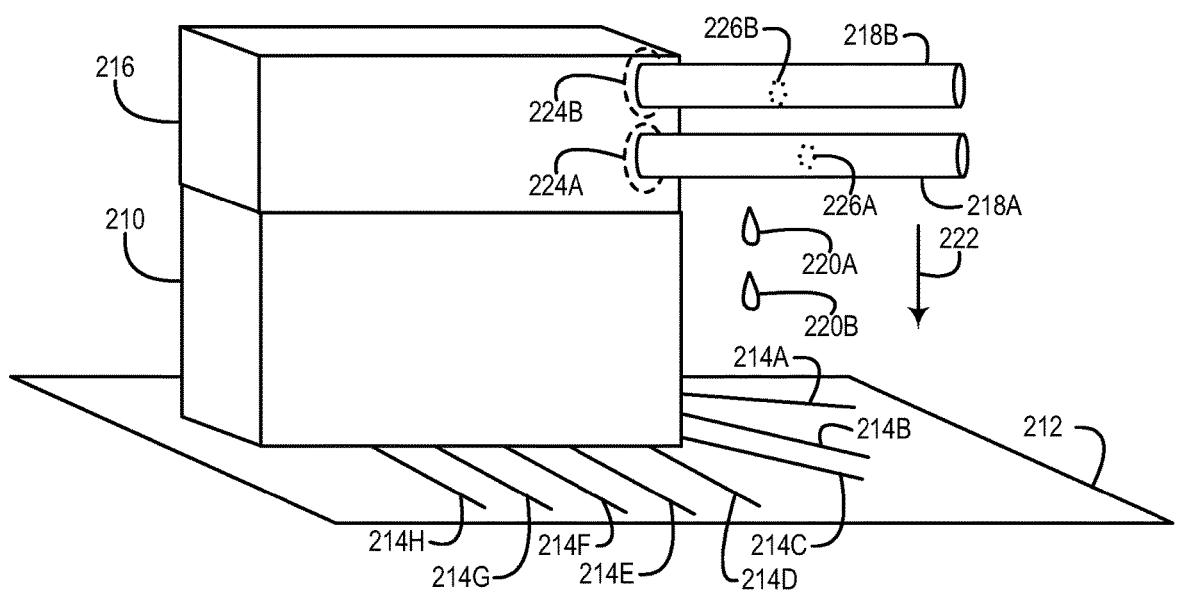
FIG. 2B illustrates another example of a circuit board and a component of an information handling system, according to one or more embodiments.

Turning now to FIG. 2B, another example of a circuit board and a component of an information handling system is illustrated, according to one or more embodiments. As shown, liquid drops 220A and 220B may have leaked. For example, liquid drops 220A and 220B may move in a direction of a gravitational force vector 222. In one or more embodiments, one or more of heat removal device 216 and liquid transfer lines 218A and 218B may be above circuit board 212 and/or component 210 with respect to gravitational force vector 222. For example, one or more of heat removal device 216 and liquid transfer lines 218A and 218B may be above circuit board 212 and/or component 210 if liquid was released from the one or more of heat removal device 216 and liquid transfer lines 218A and 218B and flow in a direction of gravitational force vector 222. For instance, the one or more of heat removal device 216 and liquid transfer lines 218A and 218B may be above circuit board 212 and/or component 210 if liquid was released from the one or more of heat removal device 216 and liquid transfer lines 218A and 218B and flow in a path that include a direction of gravitational force vector 222.

In one or more embodiments, liquid may leak from a junction 224 of heat removal device 216 and liquid transfer line 218. In one example, one or more of liquid drops 220A and 220B may leak from a junction 224A. In another example, one or more of liquid drops 220A and 220B may leak from a junction 224B. In one or more embodiments, liquid may leak from a liquid transfer line portion 226. In one example, one or more of liquid drops 220A and 220B may leak from a liquid transfer line portion 226A. In another example, one or more of liquid drops 220A and 220B may leak from a liquid transfer line portion 226B. In one or more embodiments, one or more of liquid drops 220A and 220B may leak onto circuit board 212. Liquid drops 220A and 220B may leak from other areas that are not specifically illustrated, according to one or more embodiments.

Turning now to FIGS. 3A-3H, examples of conductors and materials are illustrated, according to one or more embodiments. As shown in FIGS. 3A-3F, conductors 310 and 312 may be separated. In one or more embodiments, a circuit may be coupled to conductors 310 and 312 via couplings 320 and 322, respectively. For example, the circuit may determine a resistance between conductors 310 and 312. In one instance, the circuit may determine a resistance between conductors 310A and 312A via couplings 320A and 322A, respectively. In another instance, the circuit may determine a resistance between conductors 310B and 312B via couplings 320B and 322B, respectively.

Figure 3A:
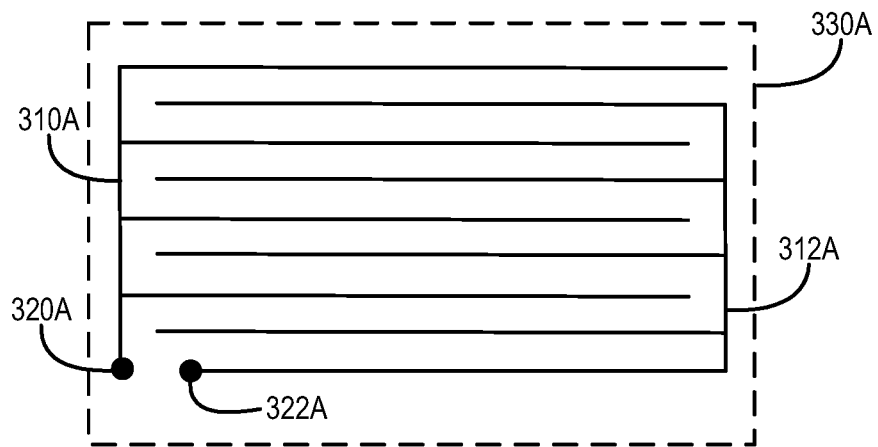
FIGS. 3A-3H illustrate examples of conductors and materials, according to one or more embodiments.
Figure 3B:
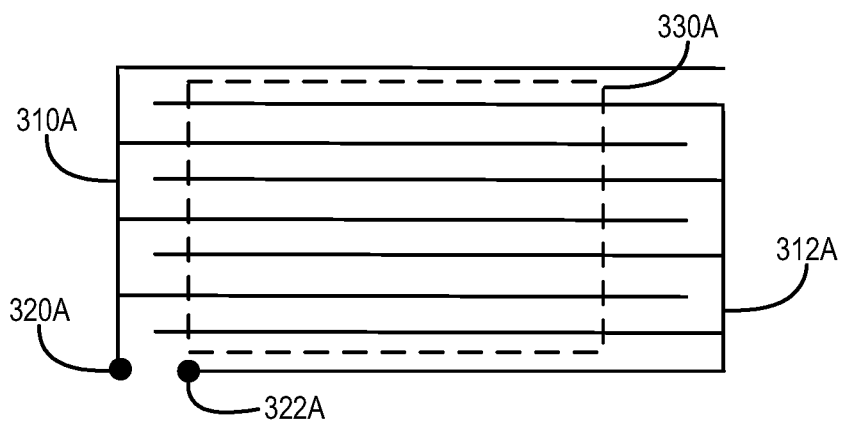
Figure 3C:
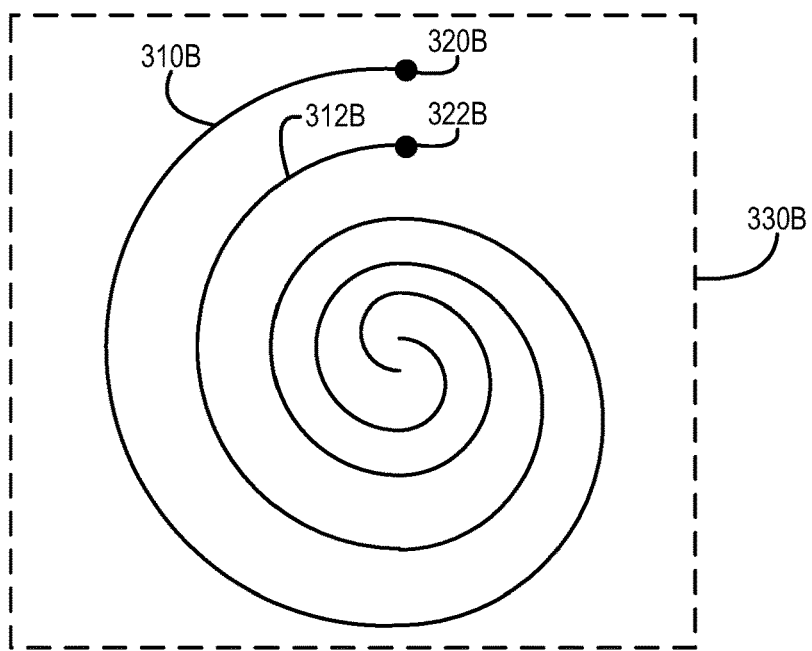
Figure 3D:
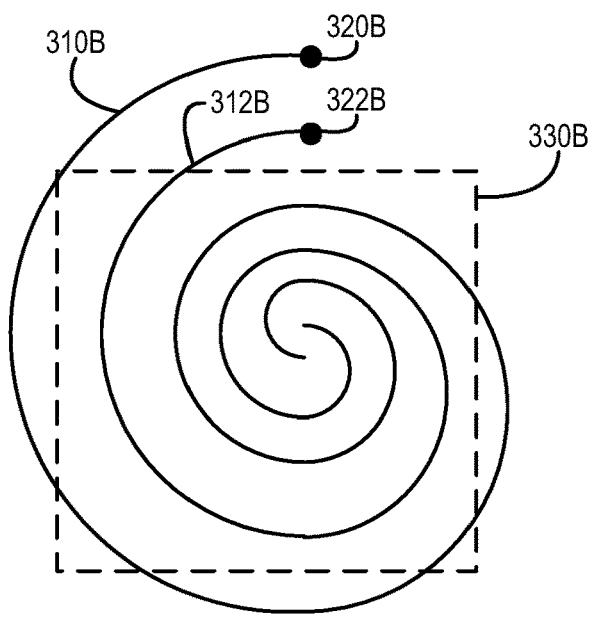
Figure 3E:
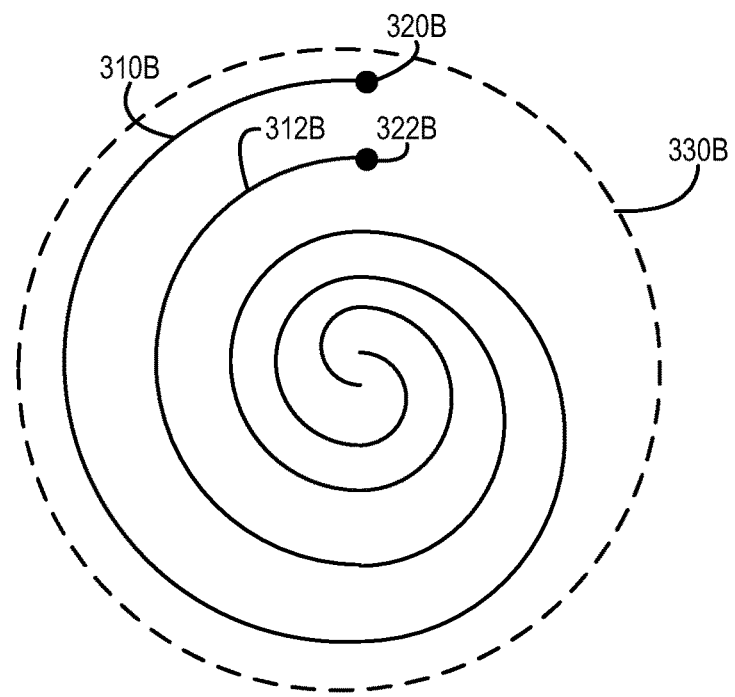
Figure 3F:
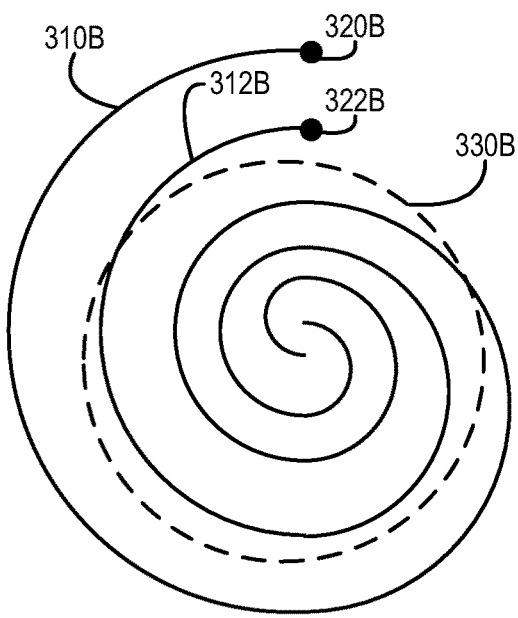
Figure 3G:
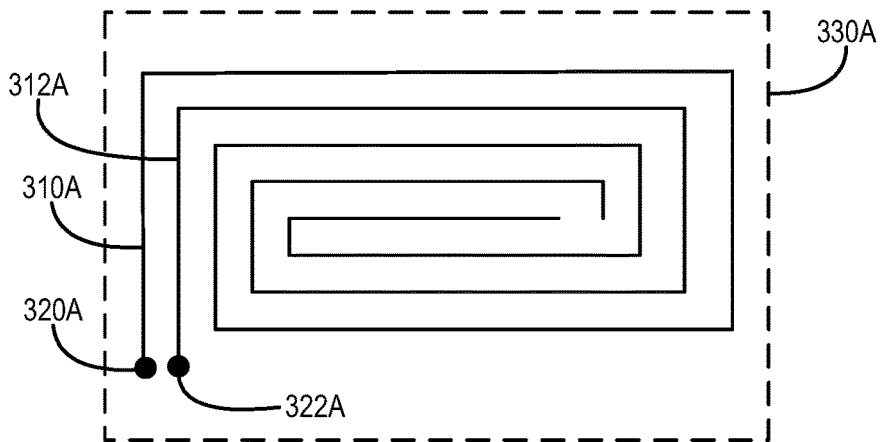
Figure 3H:
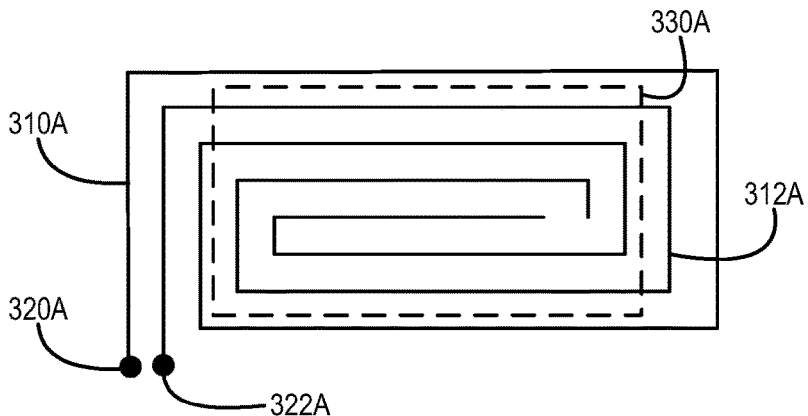

In one or more embodiments, conductors 310 and 312 may be placed on a material 330. In one or more embodiments, material 330 may be placed on conductors 310 and 312. As shown in FIGS. 3A and 3B, conductor 310A may form an "E" pattern. As illustrated in FIGS. 3A and 3B, conductor 312A may form a reverse or backwards "E" pattern. As shown in FIGS. 3C-3H, conductors 310B and 312B may form a spiral pattern. As illustrated in FIGS. 3A, 3C, 3E, and 3G, material 330 may be associated with an area that is larger than an area associated with conductors 310 and 312. As shown in FIGS. 3B, 3D, 3F, and 3H, material 330 may be associated with an area that is smaller than an area associated with conductors 310 and 312. As illustrated in FIGS. 3A and 3B, material 330A may be associated with a rectangular shape. As shown in FIGS. 3C and 3D, material 330B may be associated with a rectangular shape. As illustrated in FIGS. 3E and 3F, material 330B may be associated with a circular shape. As shown in FIGS. 3G and 3H, material 330A may be associated with a rectangular shape.

In one or more embodiments, material 330 may include a substance that forms an electrically conductive solution when dissolved by a polar solvent. For example, the substance that forms the electrically conductive solution when dissolved by the polar solvent may include a salt. For instance, a salt may include one or more of sodium chloride (NaCl), potassium chloride (KaCl), and sodium bicarbonate (NaHCO$_3$), among others. In one or more embodiments, when the substance that forms the electrically conductive solution when dissolved by the polar solvent is dissolved in a liquid, a solution of the substance and the liquid may permit conductivity between conductors 310 and 312. In one example, the liquid may include water. For instance, the liquid may include a percentage of water. In another example, when a salt is dissolved in the liquid that includes water or a percentage of water, a solution of the salt and the liquid may permit conductivity between conductors 310 and 312.

Figure 3I:
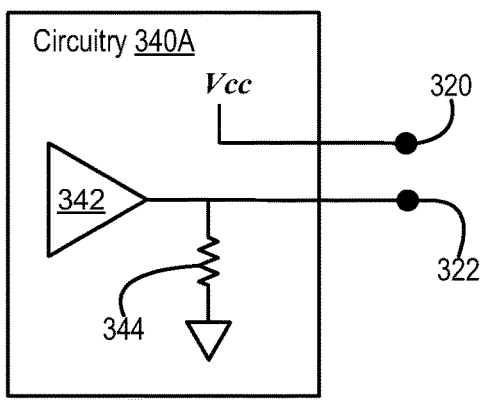
FIG. 3I illustrates an example of circuitry and couplings, according to one or more embodiments.

Turning now to FIG. 3I, an example of circuitry and couplings is illustrated, according to one or more embodiments. As shown, circuitry 340A may be coupled to couplings 320 and 322. In one or more embodiments, circuitry 340A may be utilized in determining conductivity between conductors 310 and 312. In one example, a voltage (e.g., Vcc) may be applied to coupling 320. In another example, an analog to digital converter (ADC) 342 may determine a voltage of coupling 322. In one or more embodiments, ADC 342 may be or include a sigma-delta ADC. In one or more embodiments, ADC 342 may provide digital voltage values to one or more of processor 120 and BMC 185, among others. As illustrated, ADC 342 may be coupled to a resistor 344. In one or more embodiments, a resistance between conductors 310 and 312 may be determined utilizing a voltage of coupling 322 and a resistance value of resistor 344. For example, an amount of current that flows through conductors 310 and 312 may be determined via determining a voltage of coupling 322 and dividing the voltage of coupling 322 by the resistance value of resistor 344. For instance, a resistance between conductors 310 and 312 may be determined via determining a difference between Vcc and the voltage of coupling 322 and dividing the difference between Vcc and the voltage of coupling 322 by the amount of current that flows through conductors 310 and 312. In one or more embodiments, circuitry 340A may not include an amplifier. For example, determining a resistance of conductors 320 and 330 may not include utilizing an amplifier. For instance, a resistance of conductors 320 and 330 may be determined without an amplifier.

Figure 3J:
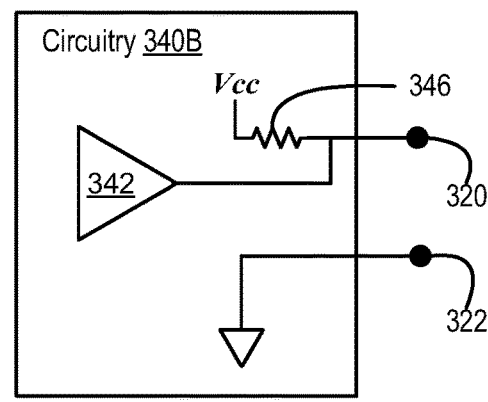
FIG. 3J illustrates another example of circuitry and couplings, according to one or more embodiments.

Turning now to FIG. 3J, another example of circuitry and couplings is illustrated, according to one or more embodiments. As shown, circuitry 340B may be coupled to couplings 320 and 322. In one or more embodiments, circuitry 340B may be utilized in determining conductivity between conductors 310 and 312. In one example, a voltage (e.g., Vcc) may be applied to a resistor 346. In another example, an ADC 342 may determine a voltage of coupling 320. In one or more embodiments, ADC 342 may be or include a sigma-delta ADC. In one or more embodiments, ADC 342 may provide digital voltage values to one or more of processor 120 and BMC 185, among others. As illustrated, ADC 342 may be coupled to resistor 346. In one or more embodiments, a resistance between conductors 310 and 312 may be determined utilizing a voltage of coupling 320 and a resistance value of resistor 346. For example, an amount of current that flows through resistor 346 may be determined via determining a difference between Vcc and a voltage of coupling 320 and dividing the difference by the resistance value of resistor 346. For instance, a resistance between conductors 310 and 312 may be determined via dividing voltage of coupling 320 by the amount of current that flows through resistor 346. In one or more embodiments, circuitry 340A may not include an amplifier. For example, determining a resistance of conductors 320 and 330 may not include utilizing an amplifier.

In one or more embodiments, IHS 110 may include circuitry 340. For example, IHS 110 may include ADC 342. In one or more embodiments, circuitry 340 may be coupled to BMC 185. In one or more embodiments, BMC 185 may include circuitry 340.

Figure 4:
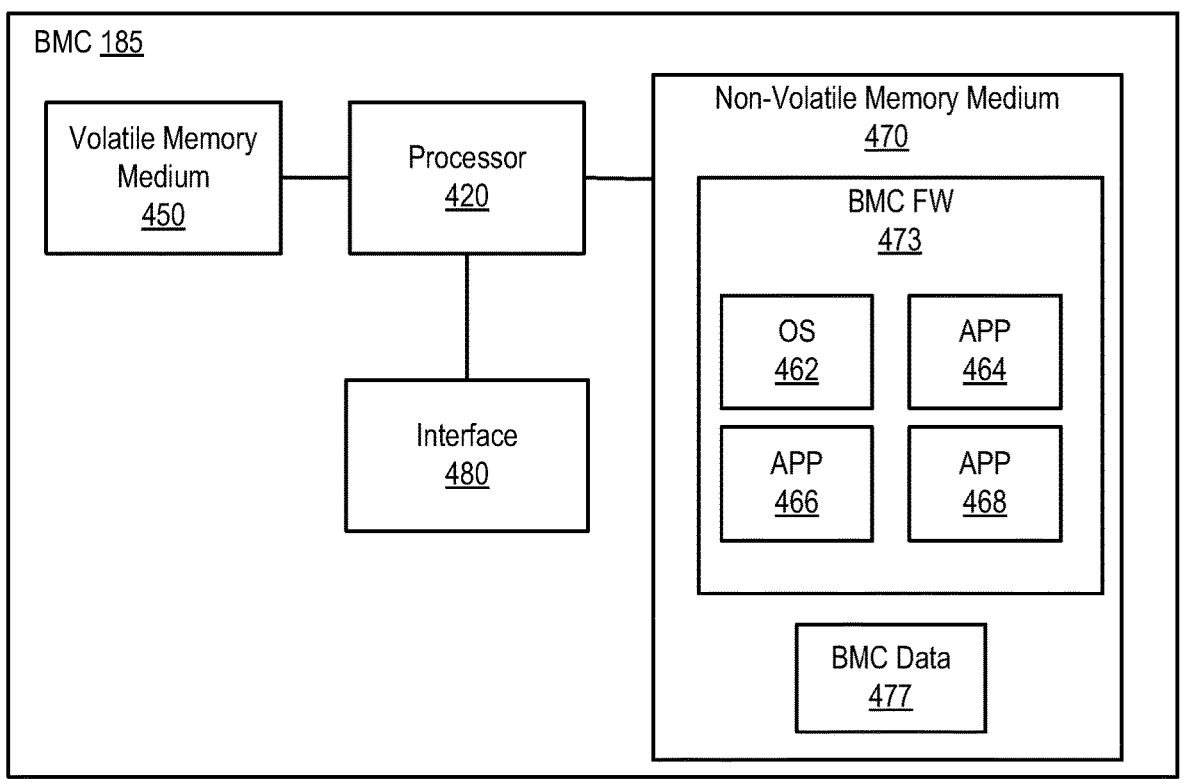
FIG. 4 illustrates an example of a baseboard management controller, according to one or more embodiments.

Turning now to FIG. 4, an example of a baseboard management controller is illustrated, according to one or more embodiments. As shown, BMC 185 may include a processor 420, a volatile memory medium 450, a non-volatile memory medium 470, and an interface 480. As illustrated, non-volatile memory medium 470 may include a BMC firmware (FW) 474, which may include an OS 462 and APPs 464-468, and may include BMC data 477. In one example, OS 462 may be or include a real-time operating system (RTOS). In another example, OS 462 may be or include an Unix-like operating system. Although not specifically illustrated, BMC 185 may include circuitry 510, according to one or more embodiments.

In one or more embodiments, interface 480 may include circuitry that enables communicatively coupling to one or more devices. In one example, interface 480 may include circuitry that enables communicatively coupling to one or more buses. For instance, the one or more buses may include one or more buses described herein, among others. In a second example, interface 480 may include circuitry that enables one or more interrupt signals to be received. In one instance, interface 480 may include general purpose input/output (GPIO) circuitry, and the GPIO circuitry may enable one or more interrupt signals to be received and/or provided via at least one interrupt line. In another instance, interface 480 may include GPIO circuitry that may enable BMC 185 to provide and/or receive signals associated with other circuitry (e.g., diagnostic circuitry, etc.). In a third example, interface 480 may include circuitry that enables communicatively coupling to one or more networks. In one instance, interface 480 may include circuitry that enables communicatively coupling to network interface 180. In a fourth example, interface 480 may include a network interface. In another example, interface 480 may include circuitry that enables communicatively coupling to circuitry 340.

In one or more embodiments, one or more of OS 462 and APPs 464-468 may include processor instructions executable by processor 420. In one example, processor 420 may execute processor instructions of one or more of OS 462 and APPs 464-468 via non-volatile memory medium 470. In another example, one or more portions of the processor instructions of the one or more of OS 462 and APPs 464-468 may be transferred to volatile memory medium 450, and processor 420 may execute the one or more portions of the processor instructions of the one or more of OS 462 and APPs 464-468 via volatile memory medium 450. In one or more embodiments, processor 420 may execute instructions in accordance with one or more of systems, flowcharts, methods, and/or processes described herein. For example, non-volatile memory medium 470 and/or volatile memory medium 460 may store instructions that may be executable in accordance with one or more of systems, flowcharts, methods, and/or processes described herein. In one or more embodiments, processor 420 may execute instructions in accordance with at least a portion of one or more of systems, flowcharts, methods, and/or processes described herein. For example, non-volatile memory medium 470 and/or volatile memory medium 460 may store instructions that may be executable in accordance with at least a portion of one or more of systems, flowcharts, methods, and/or processes described herein. In one or more embodiments, processor 420 may utilize BMC data 477. In one example, processor 420 may utilize BMC data 477 via non-volatile memory medium 470. In another example, one or more portions of BMC data 477 may be transferred to volatile memory medium 450, and processor 420 may utilize BMC data 477 via volatile memory medium 450.

Figure 5A:
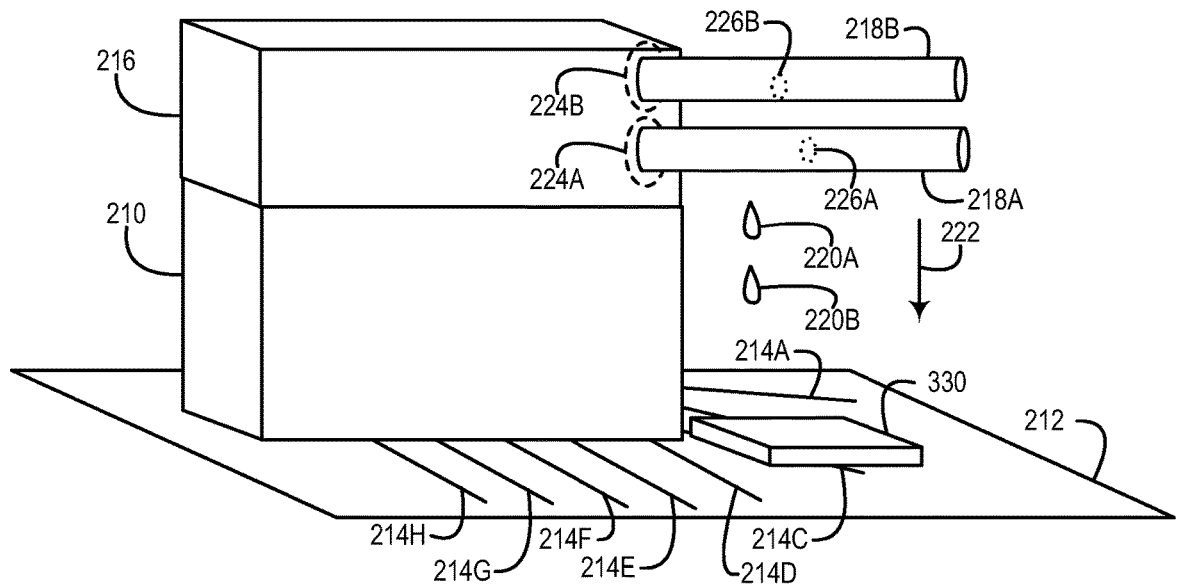
FIGS. 5A and 5B illustrate examples of a liquid and a material, according to one or more embodiments.
Figure 5B:
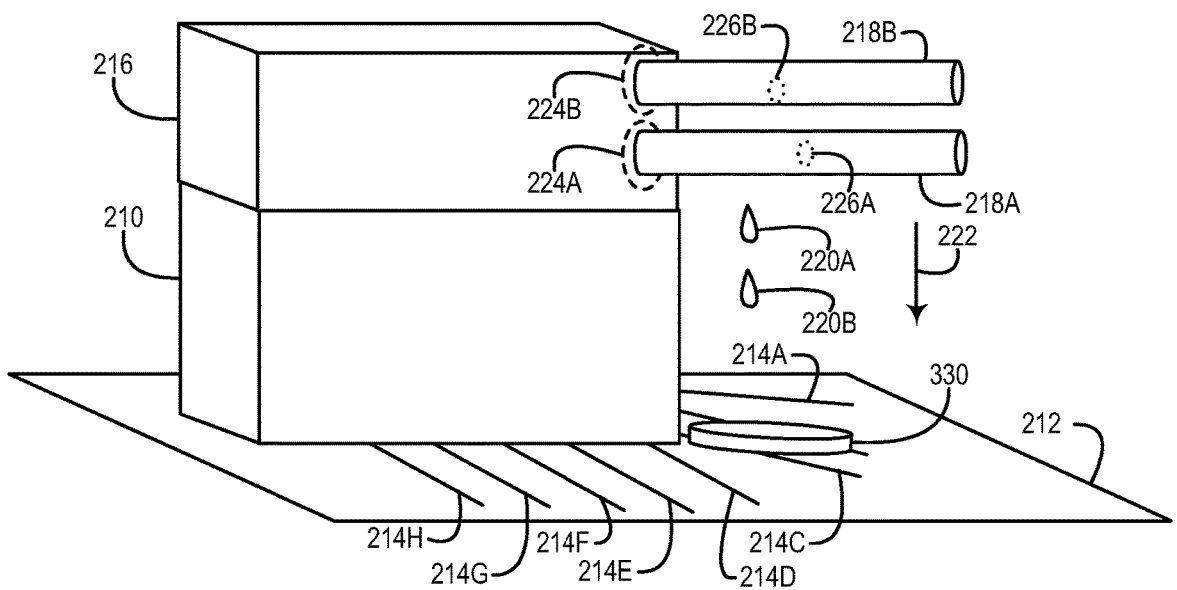

Turning now to FIGS. 5A and 5B, examples of a liquid and a material are illustrated, according to one or more embodiments. As shown in FIGS. 5A and 5B, liquid 220A and 220B may fall onto material 330. For example, liquid 220A and 220B travel in a direction of gravitational force vector 222. For instance, one or more of liquid transfer lines 218A and 218B may be above material 330 with respect to gravitational force vector 222. As illustrated in FIG. 5A, material 330 may be associated with a rectangular shape. As shown in FIG. 5B, material 330 may be associated with a circular shape.

In one or more embodiments, one or more of liquid 220A and 220B, among others, may form a solution with a material that includes a substance that forms an electrically conductive solution when dissolved by a polar solvent of material 330. For example, material 330 may include the substance. In one instance, the substance may be fastened to material 330. In another instance, the substance may be embedded in material 330. In one or more embodiments, liquid 220 may include water. For example, liquid 220 may include a percentage of water. For instance, water of liquid 220 may form a solution with the substance of material 330. In one or more embodiments, the solution with the substance of material 330 may permit an amount of current to flow through conductors 310 and 312.

Figure 5C:
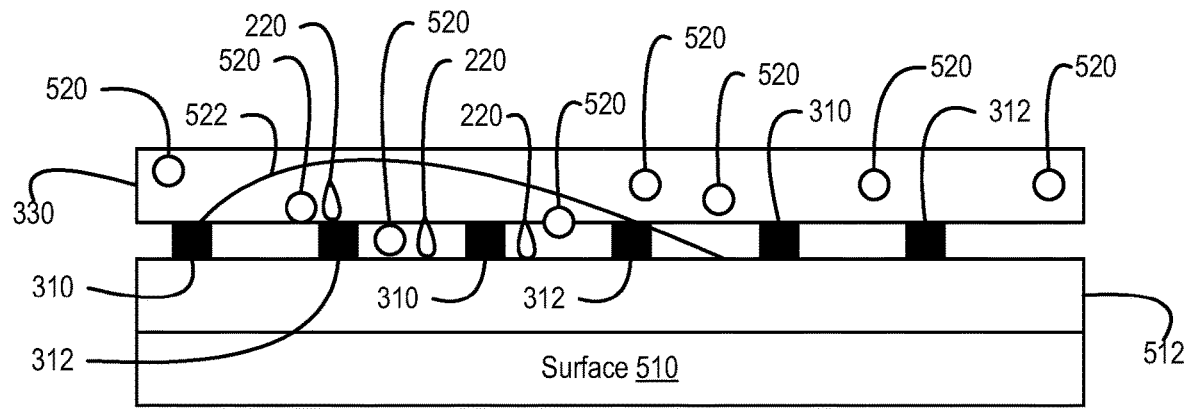
FIG. 5C illustrates an example of a cross-section of a solution that includes a liquid and a substance that forms an electrically conductive solution when dissolved by a polar solvent, according to one or more embodiments.

Turning now to FIG. 5C, an example of a cross-section of a solution that includes a liquid and a material that includes a substance that forms an electrically conductive solution when dissolved by a polar solvent is illustrated, according to one or more embodiments. As shown, conductors 310 and 312 may be fasted to a surface 510 via a fastener 512. In one or more embodiments, fastener 512 may be or include an adhesive material. In one or more embodiments, surface 510 may be or include at least a portion of circuit board 212. As illustrated, material 330 may include a material that includes a substance 520 that forms an electrically conductive solution when dissolved by a polar solvent. In one or more embodiments, liquid 220 and substance 520 may mix to form a solution 522. For example, solution 522 of liquid 220 and substance 520 may permit an amount of current to flow between conductors 310 and 312. In one or more embodiments, solution 522 may include water and a salt. For example, conductors 310 and 312 in solution 522 may have a lower resistance than conductors 310 and 312 not in solution 522. In one or more embodiments, material 330 may absorb liquid 220. For example, material 330 may absorb liquid 220, which may permit an amount of time to respond to a determination that a leak of liquid 220 has occurred. For instance, material 330 may absorb liquid 220, which may prevent or at least inhibit a leak of liquid 220 from advancing beyond material 330 for an amount of time.

Although fastener 512 is illustrated as continuous, fastener 512 may not be continuous, according to one or more embodiments. In one example, fastener 512 may include rows of an adhesive material. In another example, fastener 512 may include multiple discrete parts an adhesive material. In one instance, the multiple discrete parts the adhesive material may be uniformly spaced and/or may be associated with uniform surface areas. In another instance, the multiple discrete parts the adhesive material may be "spattered". Although not specifically illustrated, a printed circuit board (PCB) may include conductors 310 and 312. In one example, the PCB may not be a non-flexible PCB. In another example, the PCB may not be a flexible PCB. In one or more embodiments, fastener 512 may fasten the PCB to surface 510.

Figure 5D:
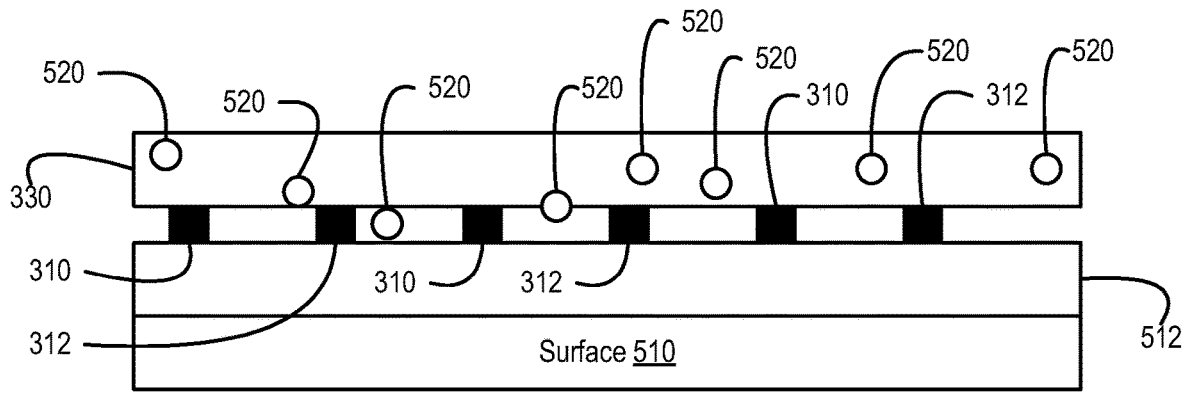
FIGS. 5D and 5E illustrate an example of a cross-section of a material and a substance that forms an electrically conductive solution when dissolved by a polar solvent, according to one or more embodiments.
Figure 5E:
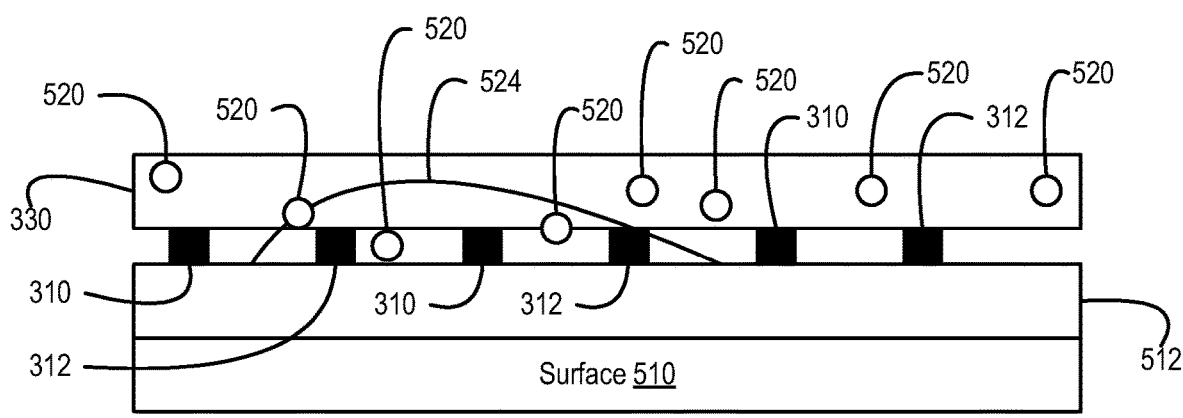

Turning now to FIGS. 5D and 5E, an example of a cross-section of a material and an electrolyte is illustrated, according to one or more embodiments. As shown, liquid 220 may be removed. For example, liquid 220 may evaporate. In one or more embodiments, when liquid 220 is removed, one or more portions of substance 520 may remain outside material 330 or may remain at least partially outside material 330. In one or more embodiments, when liquid 220 is removed, solution 522 may no longer be present. In one example, when liquid 220 is removed, resistance between conductors 310 and 312 may increase. For instance, resistance between conductors 310 and 312 may increase even though substance 520 may remain between conductors 310 and 312. In another example, when liquid 220 is removed, conductors 310 and 312 may be an open circuit. For instance, conductors 310 and 312 may be an open circuit even though substance 520 may remain between conductors 310 and 312.

In one or more embodiments, a portion of liquid 220 may be removed. For example, the portion of liquid 220 that may be removed may be or include a polar solvent. For instance, the polar solvent may be or include water. In one or more embodiments, the portion of liquid 220 may evaporate. For example, the portion of liquid 220 may be removed via evaporation. In one or more embodiments, the polar solvent may be mechanically removed. For example, the polar solvent may be or include water.

In one or more embodiments, when the portion of liquid 220 is removed, solution 522 may no longer be present. In one example, when the portion of liquid 220 is removed, resistance between conductors 310 and 312 may increase. For instance, when the water is removed, resistance between conductors 310 and 312 may increase. In another example, when the portion of liquid 220 is removed, conductors 310 and 312 may be an open circuit. For instance, when the water is removed, conductors 310 and 312 may be an open circuit.

In one or more embodiments, when the water is removed, another solution may remain. For example, when the water is removed, a solution 524 of substance 520 and glycol may remain. In one instance, resistance between conductors 310 and 312 in solution 524 of substance 520 and glycol may be associated with a higher resistance than resistance between conductors 310 and 312 in solution 522. In another instance, conductors 310 and 312 may be an open circuit in solution 524 of substance 520 and glycol.

Figure 6A:
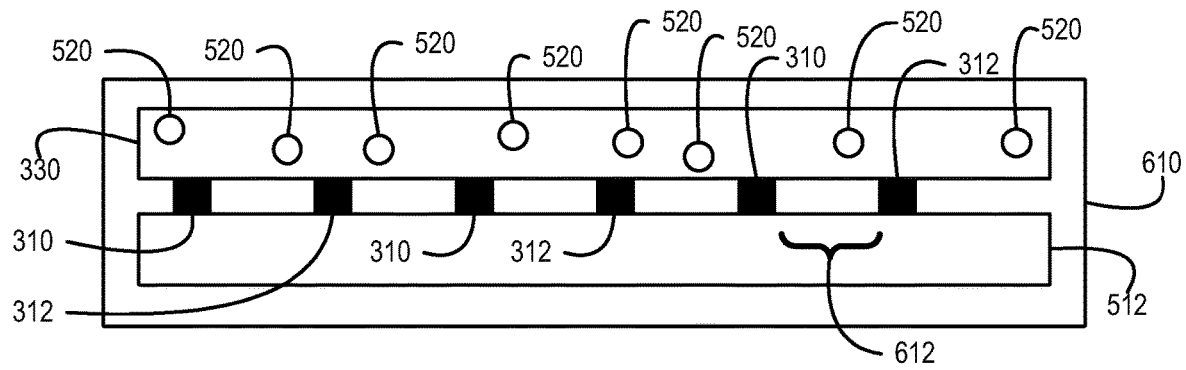
FIGS. 6A-6C illustrate examples of a device, according to one or more embodiments.

Turning now to FIG. 6A, an example of a device is illustrated, according to one or more embodiments. As shown, a device 610 may include fastener 512, conductors 310 and 312, and material 330. As illustrated, conductors 310 and 312 may be separated by a distance 612. In one or more embodiments, device 610 may include a form factor of a label.

Figure 6B:
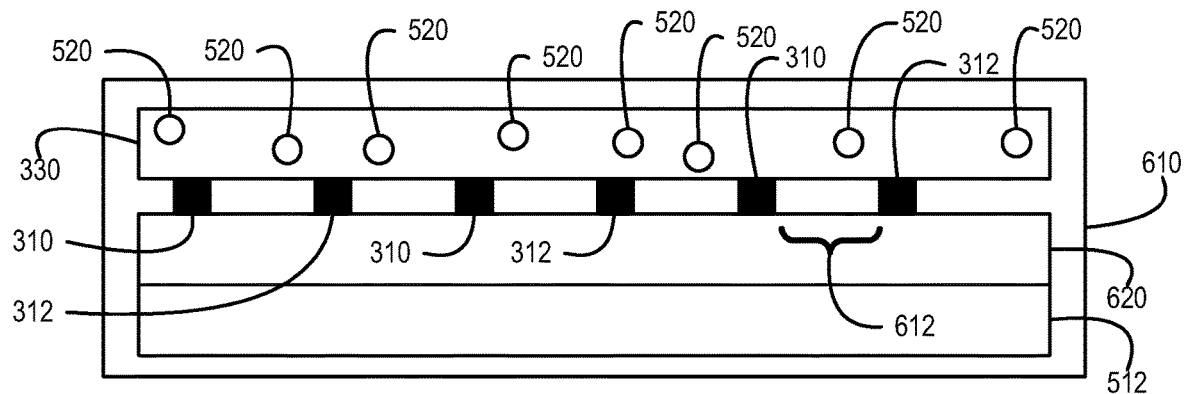

Turning now to FIG. 6B, a second example of a device is illustrated, according to one or more embodiments. As shown, device 610 may include a PCB 620. In one or more embodiments, PCB 620 may include conductors 310 and 312. In one example, PCB 620 may not be a non-flexible PCB. In another example, PCB 620 may not be a flexible PCB. In one or more embodiments, conductors 310 and 312 may be located on a first side of PCB 620. In one or more embodiments, fastener 512 may be located on a second side of PCB 620. For example, fastener 512 may fasten PCB 620 to surface 510. In one or more embodiments, fastener 512 may include an adhesive material. As illustrated, conductors 310 and 312 may be separated by a distance 612. In one or more embodiments, device 610 may include a form factor of a label. In one or more embodiments, at least a portion of conductors 310 and 312 may be exposed. For example, at least a portion of conductors 310 and 312 may not be covered by a solder mask.

Figure 6C:
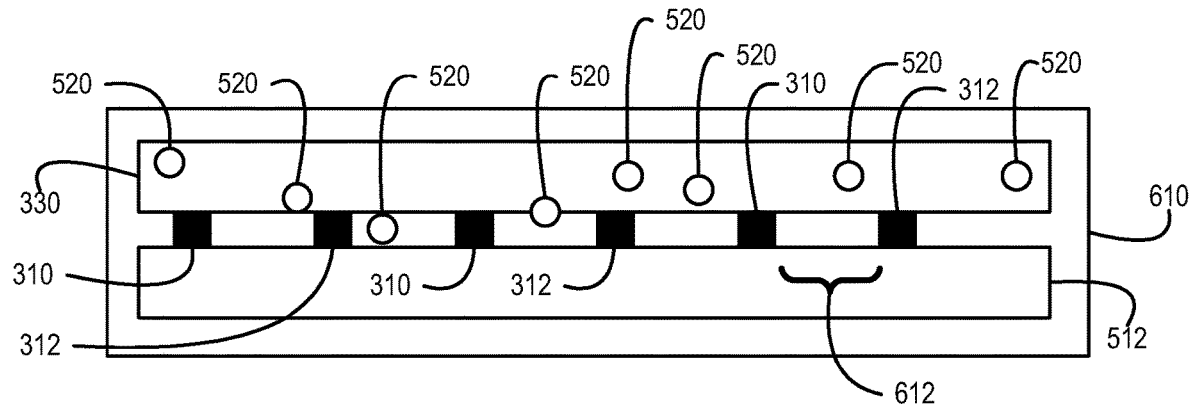

Turning now to FIG. 6C, another example of a device is illustrated, according to one or more embodiments. In one or more embodiments, one or more portions of substance 520 may remain outside material 330 or may remain at least partially outside material 330 after liquid 220 is removed. In one or more embodiments, one or more portions of substance 520 may remain outside material 330 or may remain at least partially outside material 330 after a portion of liquid 220 is removed. For example, the portion of liquid 220 that may be removed may be or include a polar solvent. For instance, the polar solvent may be or include water.

Figure 7:
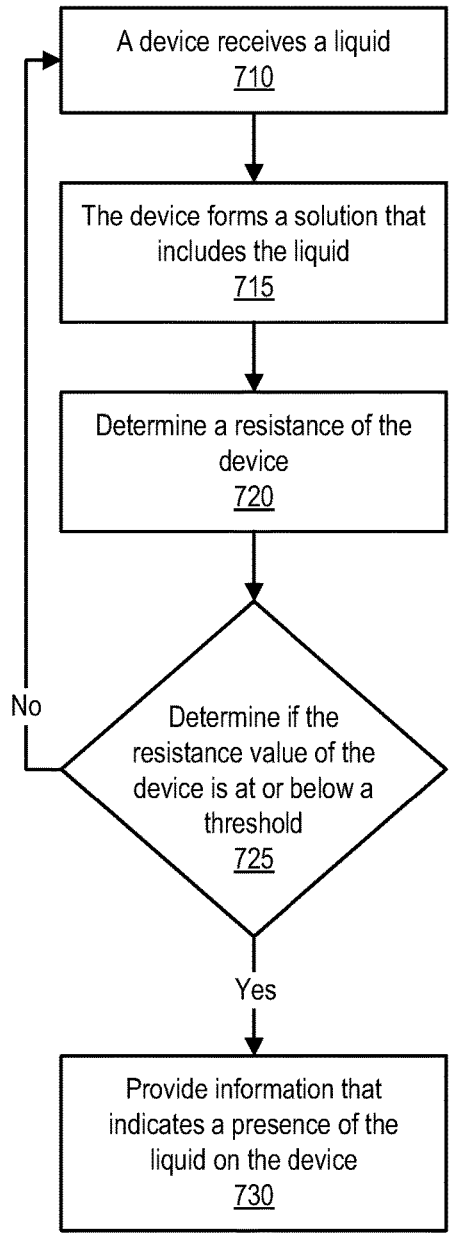
FIG. 7 illustrates an example of a method, according to one or more embodiments.

Turning now to FIG. 7, an example of a method is illustrated, according to one or more embodiments. At 710, a device may receive a liquid. For example, a device, that includes multiple exposed conductors separated from each other by a distance and a material that includes a material that includes a substance that forms an electrically conductive solution when dissolved by a polar solvent, may receive a liquid. For instance, device 610 may receive liquid 220. At 715, the device may form a solution that includes the liquid. For example, the device may form a solution of the substance and the liquid. For instance, device 610 may form solution 522.

At 720, a resistance value of the device may be determined. For example, a resistance value of device 610 may be determined. For instance, the resistance value may be a number of Ohms. In one or more embodiments, determining the resistance value of the device may include an ADC determining a voltage value associated with a conductor of the multiple conductors. For example, ADC 342 may determine a voltage value associated with a conductor of conductors 310 and 312. For instance, the voltage value may be a digital voltage value. In one or more embodiments, determining the resistance value of the device may include determining a resistance value of multiple exposed conductors, separated from each other by a distance, of the device. For example, determining the resistance value of the device may include determining a resistance value of conductors 310 and 312. For instance, determining the resistance value of conductors 310 and 312 may include determining a resistance value between conductors 310 and 312.

In one or more embodiments, determining the resistance value of the device may include determining an amount of current that flows through a resistor as an amount of current that flows through the device. In one example, an amount of current that flows through resistor 344 may be determined as an amount of current that flows through device 610. For instance, a resistance value associated with resistor 344 may be known. In another example, an amount of current that flows through resistor 346 may be determined as an amount of current that flows through device 610. For instance, a resistance value associated with resistor 346 may be known. In one or more embodiments, one or more of a resistance value associated with resistor 344 and a resistance value associated with resistor 346, among others, may be stored via one or more of volatile memory medium 150, non-volatile memory medium 160, non-volatile memory medium 170, volatile memory medium 450, and non-volatile memory medium 470, among others. In one or more embodiments, a resistance value of device 610 may be determined without an amplifier. For example, a resistance value of device 610 may be determined without utilizing an amplifier.

At 725, it may be determined if the resistance value of the device is at or below a threshold resistance value. In one example, circuitry 340 may determine if the resistance value of the device is at or below the threshold resistance value. In a second example, BMC 185 may determine if the resistance value of the device is at or below the threshold resistance value. In another example, IHS 110 may determine if the resistance value of the device is at or below the threshold resistance value. For instance, processor 120 may determine if the resistance value of the device is at or below the threshold resistance value. In one or more embodiments, the threshold resistance value may be one hundred Ohms, among others. For example, a resistance between conductors 310 and 312 may be equal to or less than one hundred Ohms, among other resistances between conductors 310 and 312, when a polar solvent is applied to material 330. In one or more embodiments, at least a portion of conductors 310 and 310 may be exposed to material 330.

In one or more embodiments, determining the amount of current that flows through the resistor may include determining a difference of a power supply voltage value and the voltage value associated with the conductor of the multiple conductors and dividing the difference by a resistance value of the resistor. For example, the power supply voltage value may be Vcc. In one instance, a difference of Vcc and a voltage value associated with conductor 310 may be determined. In another instance, difference of Vcc and a voltage value associated with conductor 310 may be divided by a resistance value of resistor 346.

In one or more embodiments, determining the amount of current that flows through the resistor includes determining a quotient of a voltage value associated with a conductor of the multiple conductors and a resistance value of the resistor. For example, a voltage value associated with conductor 312 may be divided by a resistance value of resistor 344.

If the resistance value of the device is not at or below the threshold resistance value, the method may proceed to 710, according to one or more embodiments. If the resistance value of the device is at or below the threshold resistance value, information that indicates a presence of the liquid on the device may be provided, at 730. For example, information that indicates a presence of liquid 220 on device 610 may be provided. In one or more embodiments, the information that indicates the presence of the liquid on the device may be provided to a network. For example, the information that indicates the presence of the liquid on the device may be provided to another information handling system via the network. In one or more embodiments, the information that indicates the presence of the liquid on the device may be provided to one or more of processor 120, OS 162, APP 164, IHSFW 172, BMC 185, a display (e.g., a display coupled to IHS 110), and a user, among others.

Figure 8:
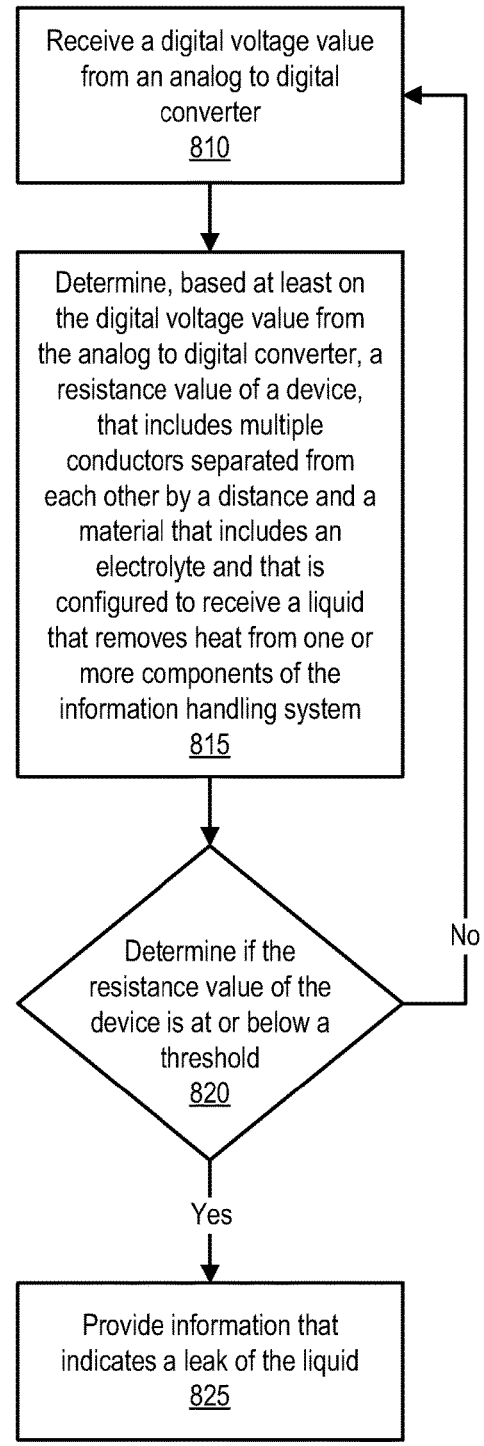
FIG. 8 illustrates a second example of a method, according to one or more embodiments.

Turning now to FIG. 8, a second example of a method is illustrated, according to one or more embodiments. At 810, a digital voltage value from an analog to digital converter may be received. For example, a digital voltage value from ADC 342 may be received. For instance, the digital voltage value from ADC 342 may be based at least on a voltage of a conductor of conductors 310 and 312. In one or more embodiments, one or more of processor 120 and BMC 185 may receive the digital voltage value from ADC 342. At 815, a resistance value of a device, that includes multiple conductors separated from each other by a distance and a material that includes an electrolyte and that is configured to receive a liquid that removes heat from one or more components of an information handling system, may be determined based at least on the digital voltage value from the analog to digital converter. For example, a resistance value of device 610 may be determined based at least on a digital voltage value from ADC 342. For instance, ADC 342 may convert an analog voltage to the digital voltage value. In one or more embodiments, determining the resistance of the device based at least on the digital voltage value from the analog to digital converter may include utilizing the digital voltage value from the analog to digital converter. In one or more embodiments, a resistance value of device 610 may be determined without an amplifier. For example, a resistance value of device 610 may be determined without utilizing an amplifier.

At 820, it may be determined if the resistance value of the device is at or below a threshold resistance value. If the resistance value of the device is not at or below the threshold resistance value, the method may proceed to 810, according to one or more embodiments. If the resistance value of the device is at or below the threshold resistance value, information that indicates a leak of the liquid may be provided, at 825. For example, information that indicates a leak of liquid 220 may be provided. In one or more embodiments, the information that indicates the leak of the liquid may be provided to a network. For example, the information that indicates the leak of the liquid may be provided to another information handling system via the network. In one or more embodiments, the information that indicates the leak of the liquid may be provided to one or more of processor 120, OS 162, APP 164, IHSFW 172, BMC 185, a display (e.g., a display coupled to IHS 110), and a user, among others. For example, the information that indicates the leak of the liquid may be provided to the one or more of processor 120, OS 162, APP 164, IHSFW 172, BMC 185, the display, and the user, among others, in response to determining that the resistance value of the device is at or below the threshold resistance value.

Figure 9:
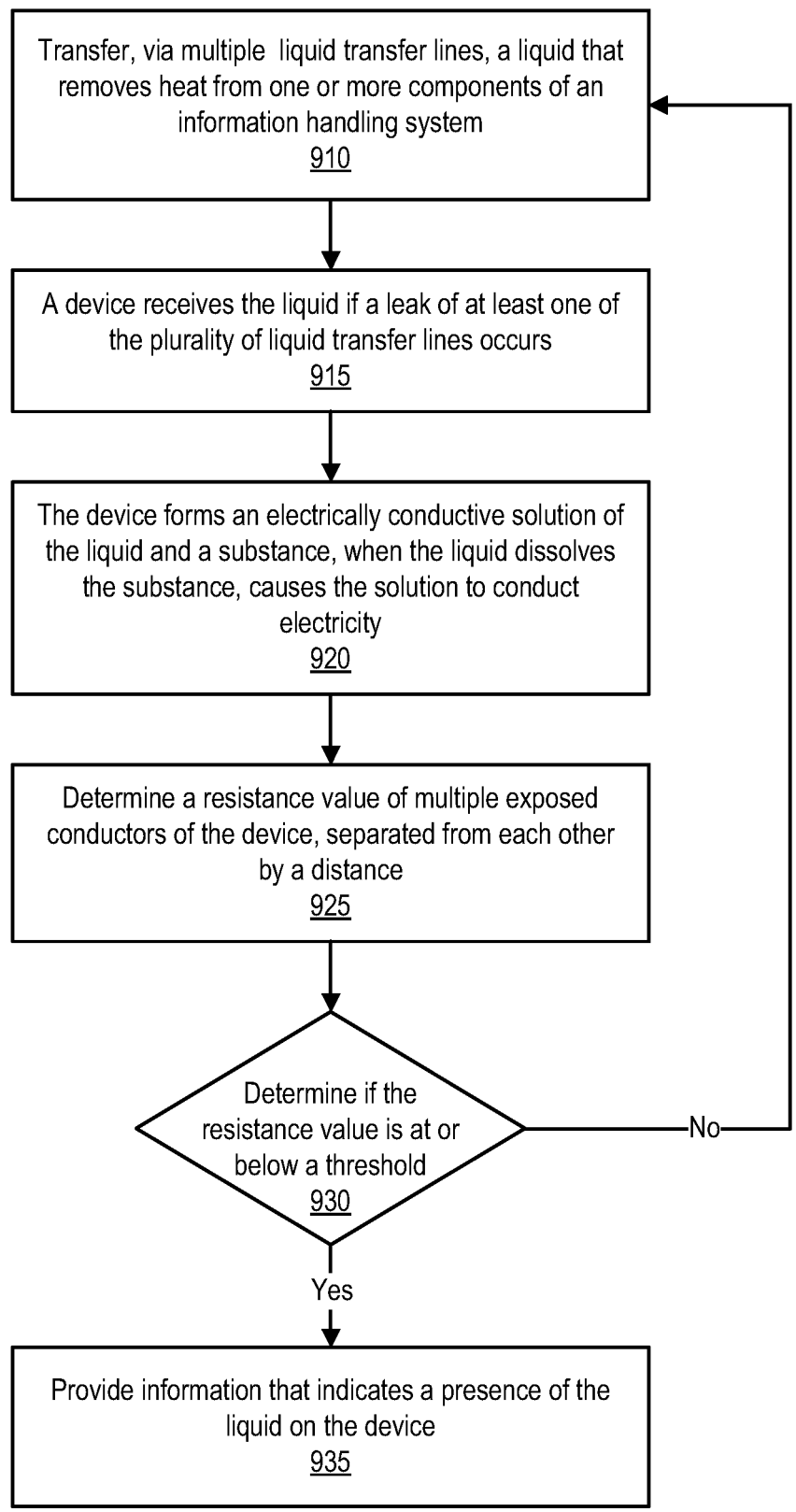
FIG. 9 illustrates another example of a method, according to one or more embodiments.

Turning now to FIG. 9, another example of a method is illustrated, according to one or more embodiments. At 910, a liquid that removes heat from one or more components of an information handling system may be transferred via multiple liquid transfer lines. For example, liquid 220 may be transferred via liquid transfer lines 218A and 218B. At 915, a device may receive liquid if a leak of at least one of the multiple liquid transfer lines occurs. For example, device 610 may receive liquid 220 if a leak of at least one of liquid transfer lines 218A and 218B occurs.

At 920, the device may form an electrically conductive solution of the liquid and a substance, when the liquid dissolves the substance, causing the solution to conduct electricity. For example, device 610 may form solution 522. For instance, device 610 may form solution 522 of liquid 220 and substance 520 that may permit an amount of current to flow between conductors 310 and 312 of device 610. At 925, a resistance value of multiple exposed conductors of the device, separated from each other by a distance, may be determined. For example, a resistance value of conductors 310 and 312 of device 610 may be determined. In one or more embodiments, a resistance value of device 610 may be or include a resistance value of conductors 310 and 312 of device 610. In one or more embodiments, a resistance value of multiple exposed conductors of the device, separated from each other by a distance, may be determined without an amplifier. For example, a resistance value of multiple exposed conductors of the device, separated from each other by a distance, may be determined without utilizing an amplifier.

At 930, it may be determined if the resistance value is at or below a threshold resistance value. For example, it may be determined if the resistance value of conductors 310 and 312 of device 610 is at or below the threshold resistance value. For instance, BMC 185 may determine if the resistance value of conductors 310 and 312 of device 610 is at or below the threshold resistance value. If the resistance value is not at or below the threshold resistance value, the method may proceed to 910, according to one or more embodiments.

If the resistance value is at or below the threshold resistance value, information that indicates a presence of the liquid on the device may be provided, at 935. For example, information that indicates a presence of the liquid on device 610 may be provided. In one or more embodiments, providing the information that indicates the presence of the liquid on the device may be performed in response to determining that the resistance value is at or below the threshold resistance value. In one or more embodiments, the information that indicates the presence of the liquid on the device may be provided to a network. For example, the information that indicates the presence of the liquid on the device may be provided to another information handling system via the network. In one or more embodiments, the information that indicates the presence of the liquid on the device may be provided to one or more of processor 120, OS 162, APP 164, IHSFW 172, BMC 185, a display (e.g., a display coupled to IHS 110), and a user, among others.

In one or more embodiments, one or more of the method and/or process elements and/or one or more portions of a method and/or a process element may be performed in varying orders, may be repeated, or may be omitted. Furthermore, additional, supplementary, and/or duplicated method and/or process elements may be implemented, instantiated, and/or performed as desired, according to one or more embodiments. Moreover, one or more of system elements may be omitted and/or additional system elements may be added as desired, according to one or more embodiments.

In one or more embodiments, a memory medium may be and/or may include an article of manufacture. For example, the article of manufacture may include and/or may be a software product and/or a program product. For instance, the memory medium may be coded and/or encoded with processor-executable instructions in accordance with one or more flowcharts, one or more systems, one or more methods, and/or one or more processes described herein to produce the article of manufacture.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
   at least one processor;
   a plurality of liquid transfer lines configured to transfer a liquid that removes heat from one or more components of the information handling system;
   a device that includes a plurality of exposed conductors separated from each other by a distance and a material that includes a substance that forms an electrically conductive solution when dissolved by a polar solvent and that is configured to receive the liquid if a leak of at least one of the plurality of liquid transfer lines occurs;
   an analog to digital converter (ADC) coupled to the at least one processor and coupled to a conductor of the plurality of exposed conductors of the device; and
   a memory medium, coupled to the at least one processor, that stores instructions executable by the at least one processor, which when executed by the at least one processor, cause the information handling system to:
      receive a digital voltage value, based at least on a voltage of the conductor of the plurality of exposed conductors, from the ADC;
      determine a resistance value of the device based at least on the digital voltage value from the ADC;
      determine that the resistance value of the device is at or below a threshold resistance value; and
      in response to determining that the resistance value of the device is at or below the threshold resistance value, provide information that indicates a leak of the liquid.

2. The information handling system of claim 1, wherein, to provide the information that indicates the presence of the liquid on the device, the instructions further cause the information handling system to provide the information that indicates the presence of the liquid on the device to a network communicatively coupled to the information handling system.

3. The information handling system of claim 1, further comprising:
   a baseboard management controller;
   wherein the baseboard management controller includes the at least one processor and the memory medium.

4. The information handling system of claim 1, wherein the substance that forms the electrically conductive solution when dissolved by the polar solvent includes at least one of sodium chloride (NaCl), potassium chloride (KaCl), and sodium bicarbonate (NaHCO$_3$).

5. The information handling system of claim 1, wherein the liquid includes water (H$_2$O).

6. The information handling system of claim 1, wherein the instructions further cause the information handling system to, in response to determining that the resistance value of the device is at or below the threshold resistance value, shut down an operating system executing on the information handling system.

7. The information handling system of claim 1, wherein the instructions further cause the information handling system to, in response to determining that the resistance value of the device is at or below the threshold resistance value, shut down the information handling system.

8. A method, comprising:
- transferring, via a plurality of liquid transfer lines, a liquid that includes a polar solvent and that removes heat from one or more components of an information handling system;
- a device receiving the liquid if a leak of at least one of the plurality of liquid transfer lines occurs;
- the device forming an electrically conductive solution of the liquid and a substance, which forms the electrically conductive solution when dissolved by the polar solvent, when the liquid dissolves the substance, causing the solution to conduct electricity;
- determining, by a processor, a resistance value of a plurality of exposed conductors of the device, separated from each other by a distance;
- determining, by the processor, that the resistance value is at or below a threshold resistance value; and
- in response to the determining, by the processor, that the resistance value is at or below the threshold resistance value, providing, by the processor, information that indicates a presence of the liquid on the device.

9. The method of claim 8, wherein the determining, by the processor, the resistance value of the plurality of exposed conductors includes an analog to digital converter (ADC) determining a voltage value associated with a conductor of the plurality of exposed conductors.

10. The method of claim 9, wherein the determining, by the processor, the resistance value of the plurality of exposed conductors further includes determining, by the processor, an amount of current that flows through a resistor as an amount of current that flows through the plurality of exposed conductors.

11. The method of claim 10, wherein the determining, by the processor, the amount of current that flows through the resistor includes determining, by the processor, a difference of a power supply voltage value and the voltage value associated with the conductor of the plurality of exposed conductors and dividing the difference by a resistance value of the resistor.

12. The method of claim 10, the determining, by the processor, the amount of current that flows through the resistor includes determining, by the processor, a quotient of the voltage value associated with the conductor of the plurality of exposed conductors and a resistance value of the resistor.

13. The method of claim 8, wherein the substance that forms the electrically conductive solution when dissolved by the polar solvent includes at least one of sodium chloride (NaCl), potassium chloride (KaCl), and sodium bicarbonate (NaHCO$_3$).

14. The method of claim 8, wherein the liquid includes water (H$_2$O).

15. The method of claim 8, further comprising:
- in response to the determining, by the processor, that the resistance value of the device is at or below the threshold resistance value, shutting down, by the processor, the information handling system.

16. The method of claim 8, wherein the information that indicates the presence of the liquid on the device includes the resistance value of the device.

\* \* \* \* \*